United States Patent [19]

Eichen et al.

[11] Patent Number: 5,034,678
[45] Date of Patent: Jul. 23, 1991

[54] METHOD OF AND APPARATUS FOR MEASURING THE FREQUENCY RESPONSE OF AN ELECTROOPTIC DEVICE USING AN OPTICAL WHITE NOISE GENERATOR

[75] Inventors: Elliot Eichen, Arlington; John Schlafer, Wayland; William Rideout, Townsend, all of Mass.; John McCabe, Londonderry, N.H.

[73] Assignee: GTE Laboratories Incorporated, Waltham, Mass.

[21] Appl. No.: 380,186

[22] Filed: Jul. 14, 1989

[51] Int. Cl.$^5$ ............................................. G01R 23/16
[52] U.S. Cl. .................................................. 324/77 K
[58] Field of Search .............. 324/77 K; 364/485, 517; 455/67, 602, 619; 356/349

[56] References Cited

U.S. PATENT DOCUMENTS 4,678,937  7/1987  Price .................................. 455/602
4,946,459  8/1990  Nelson et al. ....................... 455/617

OTHER PUBLICATIONS

Burrus et al., "Improved Very-High Speed...", Elect. Lett. 21(7), pp. 262–263 (1985).
Piccari and Spano, "New Method for Measuring Ultrawide...", Elect. Lett. 18(3), pp. 116–118 (1982).
Peyton et al., "High-Sensitivity Receiver...", IEEE J. of Quantum Elec. QE-8, No. 2, pp. 252–263 (1972).
Peyton, "Wideband Infrared Heterodyne...", Final Report for NASA Contract NAS-5-23119 (Aug. 1974).
Kaneda et al., "Avalanche Buildup Time...", J. Applied Physics, vol. 47, No. 11, pp. 4960–4963 (1976).
Eichen and Silletti, "Bandwidth Measurements of Ultra-High Frequency...", J. Lightwave Tech. LT-5(10), pp. 1377–1381 (1987).
Anderson et al., "Temporal and Frequency Response...", Appl. Optics 19(20), pp. 3496–3499 (1980).
Blauvett et al., "Fabrication and Characterization...", Appl. Phys. Lett. 45(3), pp. 195–196 (1984).

Primary Examiner—Hezron E. Williams
Assistant Examiner—Louis M. Arana
Attorney, Agent, or Firm—Victor F. Lohmann, III

[57] ABSTRACT

A system for measuring the frequency response of an electrooptic device, such as an optical detector, includes an optical amplifier for generating an optical white noise spectrum that is delivered to the detector. In a first embodiment, an optical amplifier or a luminescent fiber amplifier generates a white noise signal due to spontaneous-spontaneous beat noise emission, while a second embodiment utilizes the signal-spontaneous and spontaneous-spontaneous beat noise emissions generated by an optical amplifier driven by a laser source. The frequency response of the detector is determined from a measurement of the detected noise signal wherein any roll-off in the response must be due to the detector since the originally generated noise spectrum is flat.

25 Claims, 4 Drawing Sheets

METHOD OF AND APPARATUS FOR MEASURING THE FREQUENCY RESPONSE OF AN ELECTROOPTIC DEVICE USING AN OPTICAL WHITE NOISE GENERATOR

FIELD OF THE INVENTION

This invention relates to the frequency response measurement of electrooptic devices, such as optical detectors, and, more particularly, to a system for measuring the frequency response of such devices by using an optical amplifier to generate a flat noise spectrum due to spontaneous-spontaneous and signal-spontaneous beat noise emissions.

BACKGROUND OF THE INVENTION

Electrooptic devices, such as photodetectors, that respond to modulation at mm-wave frequencies are becoming increasingly important for very high speed digital fiber-optic communications links, and for optical transmission and signal processing of microwave and radar signals. Unfortunately, it has become increasingly difficult to measure the frequency response of these devices once their bandwidth exceeds 20 GHz primarily because it is difficult to separate the response of the detector from the response of the measurement system used to analyze the detector. Although a number of methods for measuring frequency response have been successfully implemented, none has been completely satisfactory as of yet. Conventional measurement systems have used directly modulated high frequency sources [Blauvelt et al., "Fabrication and Characterization of GaAs Schottky Barrier Photodetectors for Microwave Fiber Optic Links", Appl. Phys. Lett. 45(3), pp. 195-196, 1984], external modulators (Blauvelt et al., supra), picosecond optical pulses [C. A. Burrus et al., "Improved Very-High-Speed Packaged InGaAs PIN Punch-Through Photodiode", Elect. Lett. 21(7), pp. 262-263 (1985)], beating two semiconductor lasers together [L. Piccari and P. Spano, "New Method for Measuring Ultrawide Frequency Response of Optical Detectors", Elect. Lett. 18(3), pp. 116-118 (1982)], and interferometrically demodulating the FM sidebands of a modulated semiconductor laser [E. Eichen and A. Silletti, "Bandwidth Measurements of Ultra-High Frequency Optical Detectors Using the Interferometric FM Sideband Technique", J. of Lightwave Tech. LT-5(10), pp. 1377-1381 (1987)]. The above-mentioned systems, however, are not suitable for measuring photodetector frequency response for the following reasons: swept frequency measurements by Blauvelt et al. require either an intensity modulated laser or an external modulator, both with a known response greater than that of the detector; time domain measurements by Burrus et al. require picosecond optical pulses which are easily affected by sampling and computational errors; and the beat frequency method as taught by Piccari and Spano requires two narrow linewidth semiconductor lasers with excellent temperature control and no optical feedback. Another method, disclosed by T. Andersson et al. in "Temporal and Frequency Response of Avalanche Photodiodes From Noise Measurements", Appl. Optics 19(20), pp. 3496-3499 (1980), uses the shot-noise spectrum from which to derive the frequency response of the photodetector. Disadvantageously, this method requires an amplification stage due to the extremely low signal levels obtained during the measurement of the shot noise frequency spectrum.

OBJECTS OF THE INVENTION

Accordingly, it is a primary object of the present invention to obviate the above-noted and other disadvantages of the prior art.

It is a further object of the present invention to provide a system for measuring the frequency response of an optical detector by generating a flat noise spectrum due to spontaneous-spontaneous beat noise with either an optical amplifier or luminescent fiber amplifier whereby the response of the detector is determined by measuring any roll-off in frequency response of the detector.

It is a further object of the present invention to provide a system for measuring the frequency response of an optical detector by using an optical amplifier driven by a laser to generate a flat noise spectrum due to signal-spontaneous and spontaneous-spontaneous beat noise emissions.

SUMMARY OF THE INVENTION

In one aspect of the present invention, a system for measuring the frequency response of a wide-bandwidth optical detector includes a means for generating an optical signal having a flat electrical noise spectrum due to spontaneous-spontaneous beat noise emission. An optical coupling means couples the optical signal from the generating means to an input of the detector, whereupon the device generates a photocurrent derived from the optical signal. A measurement means determines the power spectrum of the photocurrent, from which the frequency response can be measured since any roll-off in the power spectrum is due to the detector. In one embodiment, the generating means includes a single optical amplifier biased to ensure that the photon density within the optical cavity is low compared with the saturation photon density, while another embodiment uses a luminescent fiber amplifier pumped by a laser to generate the white noise spectrum. The former embodiment is extended to include a plurality of optical amplifiers cascaded together in order to increase the generation of spontaneous-spontaneous beat noise. Preferred embodiments of the present invention will include a multimode fiber as the optical coupling means to enhance the collection of white noise, and a multimode amplifier to increase the generation of spontaneous-spontaneous beat noise.

In another aspect of the present invention, the generating means provides an optical signal having a flat electrical spectrum due to both signal-spontaneous and spontaneous-spontaneous beat noise emissions. In a manner similar to the aforementioned system which generates only spontaneous-spontaneous beat noise, the optical detector generates a photocurrent whose power spectrum is likewise determined by a measurement means. The white noise spectrum is generated by an optical amplifier driven by a laser or, more preferably, by a plurality of amplifiers cascaded together and each driven by a corresponding laser. Preferred embodiments to enhance the generation and collection of spontaneous-spontaneous and signal-spontaneous beat noise emissions include multimode coupling fiber, multimode lasers, and multimode optical amplifiers. Again, any roll-off in the measured power spectrum would be due to the optical detector.

DETAILED DESCRIPTION OF THE PREFERRED EMBODIMENTS

Figure 1:
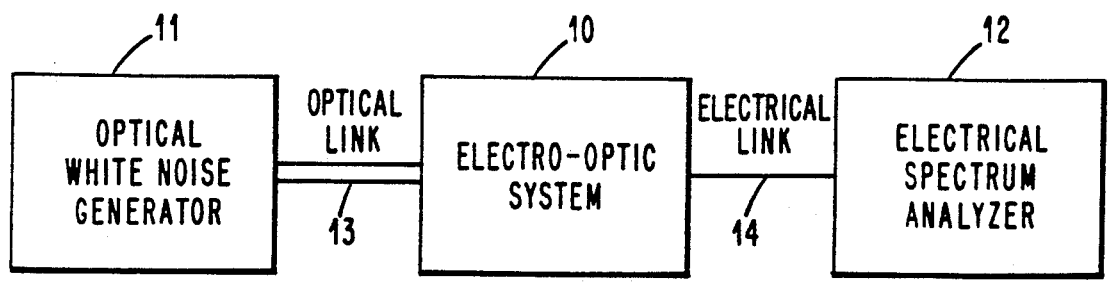
FIG. 1 is a block diagram of the present invention in which a source of optical white noise is used to measure the frequency response of an electrooptic system.

A block diagram of a measurement system in accordance with the present invention for determining the frequency response of an electrooptic device is shown in FIG. 1 to illustrate the principal elements of the system and their cooperative relationship. Referring to FIG. 1, an optical white noise generator 11 provides a flat spectrum due to spontaneous-spontaneous beat noise emission in one embodiment of the present invention, and provides a flat spectrum due to both signal-spontaneous and spontaneous-spontaneous beat noise emissions in another embodiment. The white noise signal is coupled via an optical link 13 to an electrooptic system 10 where the noise signal is optically detected and converted into a photocurrent that is subsequently transferred by an electrical link 14 to a conventional electrical spectrum analyzer 12. The power spectrum of the photocurrent, as determined by the analyzer 12, permits a measurement of the frequency response of the electrooptic system since any roll-off in the power spectrum is due to the electrooptic device.

The following discussions regarding FIGS. 2-5 disclose embodiments of the present invention in which several alternative means are used to implement the optical white noise generator 11 and optical link 13 set forth in FIG. 1. As will be evident in the drawings, there is a correspondence between the descriptive labels in the block diagram and the representative elements in the drawings that is indicated by designating common elements with the same reference numeral.

Before proceeding with a detailed description of each embodiment, it would be useful to discuss the characteristics of semiconductor optical amplifiers and luminescent fiber amplifiers, the sources of optical white noise utilized in the present invention. It should be apparent to those skilled in the art that other sources of white noise which produce noise at a sufficiently high level so as to allow measurable detection without amplification can be used. Therefore, alternative embodiments using these other sources fall within the scope of the invention.

Semiconductor optical amplifiers are semiconductor lasers whose facets have been anti-reflection coated to suppress optical feedback. The semiconductor optical amplifiers are pumped electrically, thus converting electrical current into light (photons). Luminescent fiber amplifiers are fabricated from optical fiber that has been doped with an appropriate rare earth or other ion. These amplifiers are pumped with a light source—usually a laser—whose wavelength is less than the wavelength of luminescence, thus converting light (photons) at one wavelength into light (photons) at a longer wavelength.

Both semiconductor optical amplifiers and luminescent fiber amplifiers can operate with extremely high photon densities, producing milliwatts of spontaneous optical emission as well as large signal gain. Intuitively, each component of the spontaneous emission can be thought of as a separate optical frequency which interferes with all other emitted optical frequency components, producing signals with beat frequencies from zero to as large as the width of the spontaneous emission optical spectrum (>>100 GHz). The beat frequency spectrum produced in this fashion is the sum over all these stochastically varying components. When the photon density inside the amplifier cavity is small, the effect of fluctuations in the carrier density on the photon density are small, and the amplitude of the beat frequency spectrum is constant. Such a flat noise spectrum is termed "white noise" in electronics. Thus an optical amplifier can be considered as an optical generator of electronic white noise. The amplitude of this noise spectrum, called spontaneous-spontaneous beat noise, is given by $$i_{sp-sp} = 2e^2(G-1)^2 N_{sp} m_t \Delta f$$

where e is the electronic charge, G is amplifier gain, $m_t$ is the number of transverse modes of the amplifier coupled to the detector, $N_{sp}$ is the population inversion coefficient, and $\Delta f$ is the effective optical bandwidth of the spontaneous emission.

Figure 2:
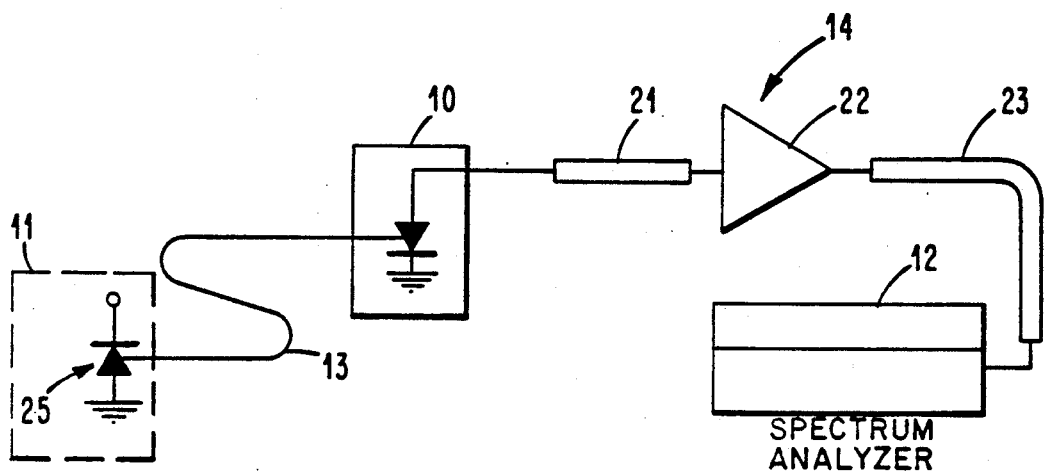
FIG. 2 is a schematic diagram of one embodiment of the present invention according to FIG. 1 wherein white noise due to spontaneous-spontaneous beat noise emission is generated by an optical amplifier.
Figure 4:
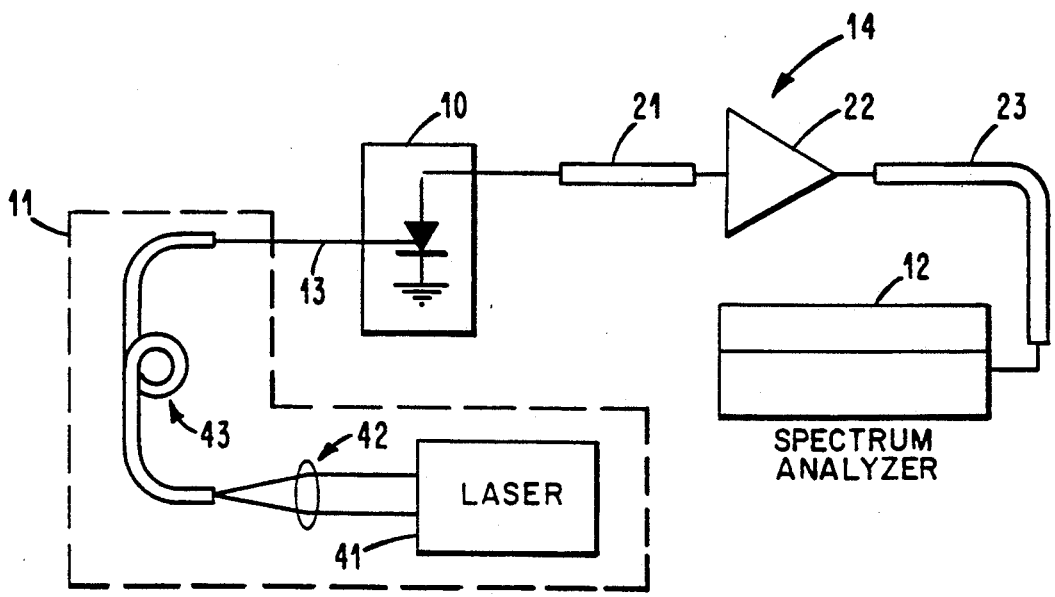
FIG. 4 is a schematic diagram of a measurement system showing an alternative means for generating a white noise spectrum due to spontaneous-spontaneous beat noise emission.
Figure 3:
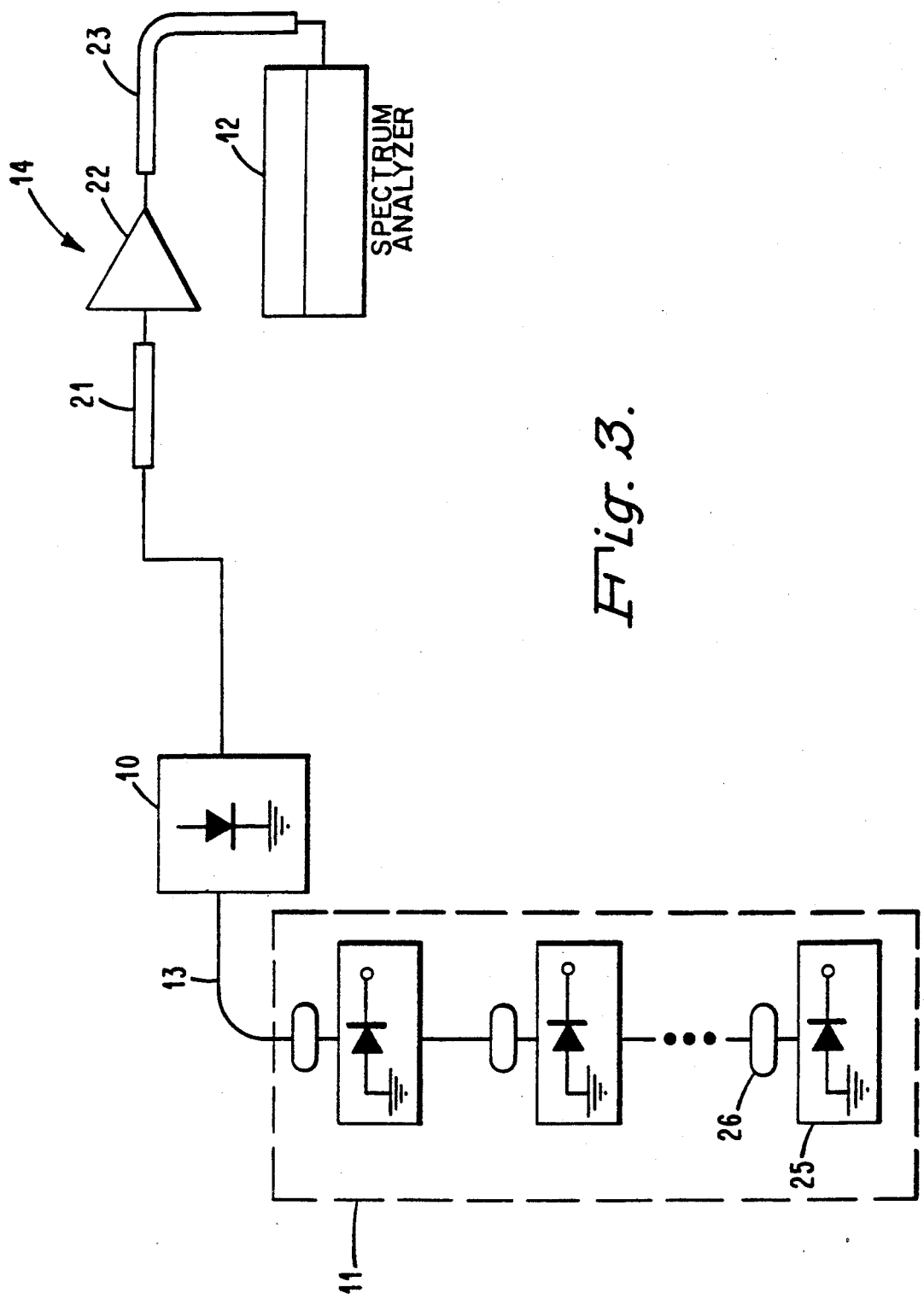
FIG. 3 is a schematic diagram according to FIG. 2 in which the generation of optical white noise is increased by using cascaded amplifiers.

With this background in mind, the following discussion of FIGS. 2-4 concerns a frequency response measurement system in accordance with a first embodiment of the present invention wherein spontaneous-spontaneous beat noise emission from a semiconductor optical amplifier (FIGS. 2 and 3) or a luminescent fiber amplifier (FIG. 4) is used to measure the frequency response of an optical detector. For the sake of consistency and clarity among the drawings, the optical white noise generator identified by numeral 11 in FIG. 1 is repeated throughout the drawings so that the specific construction of the generator clearly follows upon a reference thereto in the discussion.

As shown in FIG. 2, the white noise signal from optical amplifier 25 is coupled by an optical link 13 to the optical detector 10. The amplifier is appropriately biased to ensure that the photon density within the optical cavity of the amplifier is low compared with the saturation photon density so that the noise spectrum is flat. The electrical link 14 which couples the photocurrent from detector 10 to spectrum analyzer 12 includes a first 50 Ω impedance matching transmission line 21 followed by an amplifier 22 whose output is coupled to a second 50 Ω impedance matching transmission line 23. The specific design of the electrical link is shown for exemplary purposes only, and serves to represent one of many practical implementations.

The inventive aspect of the measurement system in FIG. 2 concerns the use of optical amplifier 25 as a source of white noise due to spontaneous-spontaneous beat noise emission, the spectrum having a sufficiently large noise level capable of being detected and directly measured. The generation of spontaneous-spontaneous beat noise emission can be increased if optical amplifier 25 is multimode, while increased collection of noise results from the use of a multimode optical fiber for optical link 13.

A modification to FIG. 2 resulting in the increased generation of spontaneous-spontaneous beat noise emissions is shown in FIG. 3 where a plurality of optical amplifiers 25 are cascaded together so that the output optical signal from one amplifier serves as the input signal to the next amplifier in the series. Optical isolators 26 are located at the output of each amplifier 25 to prevent back-reflections.

FIG. 4 shows a measurement system similar to that in FIG. 2, except that the optical white noise generation is now accomplished by a luminescent fiber amplifier, shown in FIG. 4 as elements 41, 42, and 43. A laser source 41 emits a light beam which is focused by a lens 42 before entering a length of optical fiber 43 that has been doped with an appropriate rare earth or other ion. The optical white noise emerging from the optical fiber 43 is coupled by optical link 13 to optical detector 10 where a photocurrent derived from the optical noise is produced and thereafter coupled through electrical link 14 to spectrum analyzer 12. In the same manner as the system of FIG. 2, the frequency response of detector 10 in FIG. 4 is determined using analyzer 12 by measuring any roll-off in the photocurrent power spectrum.

Similar to spontaneous-spontaneous beat noise is signal-spontaneous beat noise in which a signal is introduced into the amplifier, and the resultant noise spectrum is due to optical interference in the detector between the signal and the spontaneous emission. In this case, the noise spectrum is also flat provided that photon density within the cavity is low compared with the saturation photon density. The amplitude of the signal-spontaneous beat noise is given by $$i_{sig-sp} = 2N_{sp}e^2G(G-1)P_{in}/h\nu$$

where $P_{in}$ is the signal power coupled to the amplifier, and $h\nu$ is the energy/photon.

Figure 5:
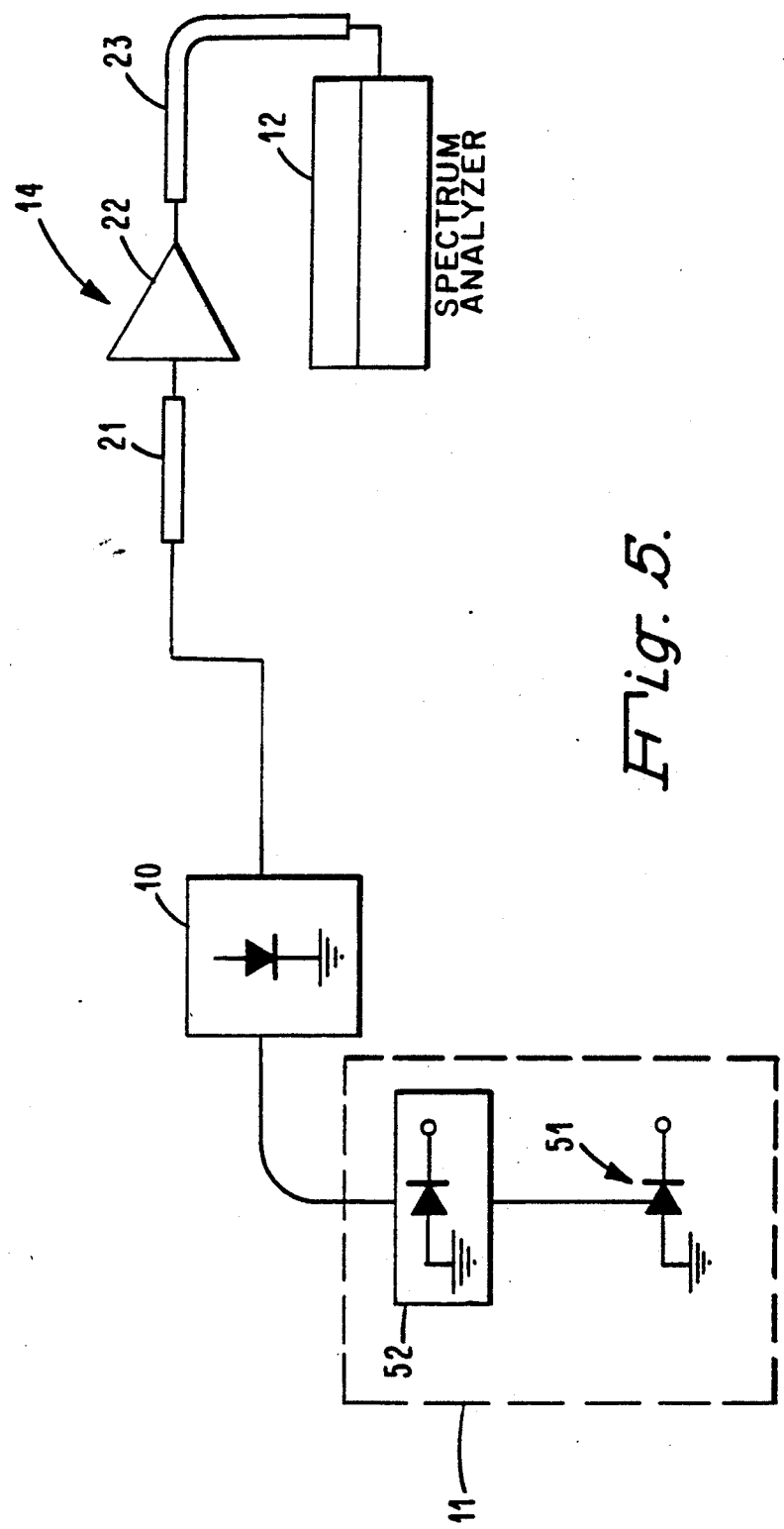
FIG. 5 is a schematic diagram of a second embodiment of the present invention according to FIG. 1 wherein both signal-spontaneous and spontaneous-spontaneous beat noise emissions contribute to the white noise spectrum used in the measurement system.

This approach using both signal-spontaneous and spontaneous-spontaneous beat noise emissions is illustrated in the frequency response measurement system of FIG. 5 where the optical white noise generator 11 consists of an optical amplifier 52 driven by a laser source 51. The extension to using a plurality of cascaded white noise generators each consisting of an optical amplifier 52 driven by a laser 51 would increase the amount of spontaneous-spontaneous and signal-spontaneous beat noise emissions delivered to detector 10. Further enhancements to increase the generation of beat noise emissions for the purposes of increasing sensitivity and ease of measurement include the following: a multimode laser source, a multimode fiber for the optical link 13, and a multimode amplifier. The amplifier, laser, and fiber can also be single mode, but in general the increase in modes causes more noise to be generated.

What has been shown and described herein is a novel frequency response measurement system using a source of optical white noise, such as an optical amplifier, to generate a noise spectrum due solely to spontaneous-spontaneous beat noise emission in one embodiment of the invention, and a noise spectrum due to both signal-spontaneous and spontaneous-spontaneous beat noise emissions in another embodiment of the invention. The white noise spectrum is optically detected and subsequently applied to a spectrum analyzer where the frequency response of the detector can be measured by virtue of the fact that any roll-off in frequency measurement must be due to the photodetector since the original noise spectrum is flat. Commercial applications for the disclosed measurement systems include instrumentation for fiber optic and satellite communications, and RF (military) systems. Furthermore, the present invention offers much higher bandwidths, and system simplicity and low cost.

Although several authors have previously discussed using electrical noise to estimate detector or receiver bandwidth [Kaneda et al. in Appl, Phys. 47, 4960 (1976); Peyton et al. in IEEE J. Quantum Elect. 8, p. 252 (1972); B. J. Peyton in "Wideband Infrared Heterodyne Receiver Front End," NASA CR-139172 (Aug. 1974); and Andersson et al., supra], it is important to note that all previous work, including work in which the photodector was illuminated by an LED, has employed shot noise (the noise has been generated by the statistical uncertainty in photon arrival time) rather than spontaneous-spontaneous or signal-spontaneous beat noise. The advantage of using spontaneous-spontaneous beat noise is that the noise density [amps$^2$/HZ] can be several orders of magnitude greater than the shot noise density, thereby making possible frequency response measurements which are not feasible using a source of shot noise.

If a detector is illuminated by the spontaneous emission from an optical amplifier, the DC photocurrent $i_{dc}$ and spontaneous-spontaneous beat noise spectral density $i_{sp-sp}2$ in [amps$^2$/HZ], are given by $$i_{dc} = eN_{sp}(G-1)\Delta f \tag{1}$$

and $$i_{sp-sp}^2 = 2\{eN_{sp}(G-1)\}^2 \Delta f = 2i_{dc}^2/\Delta f \tag{2}$$

as disclosed by N. A. Olsson in "Lightwave Systems with Optical Amplifiers", J. of Lightwave Tech., Vol. 7, pp. 1071–1082 (1989). The shot noise spectral density [amps$^2$/HZ], $i_{shot}$, generated by this dc photocurrent is given by $$i_{shot}^2 = 2e\, i_{dc} \tag{3}$$

Figure 6:
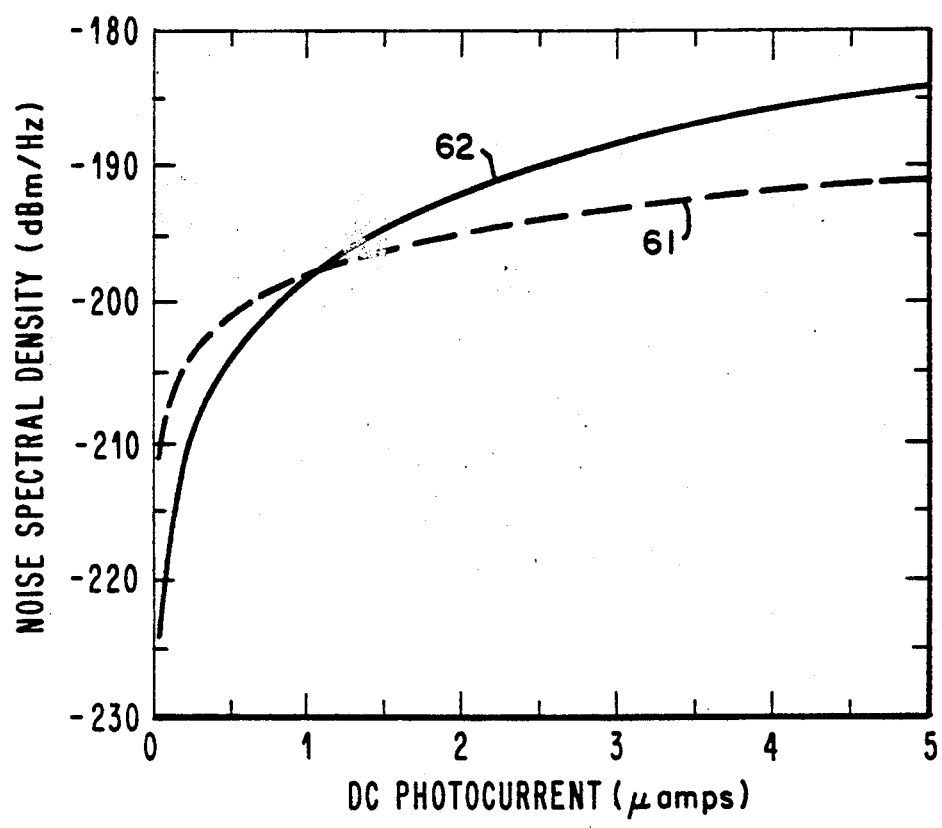
FIG. 6 is a graph showing the noise spectral density produced by shot noise and spontaneous-spontaneous beat noise for an optical amplifier with a reasonable noise figure and a 50 nm equivalent optical bandwidth.

Since the shot noise spectral density (curve 61) is linear in photocurrent while the spontaneous-spontaneous spectral density (curve 62) is quadratic, as seen in FIG. 6, for low photocurrents the shot noise component is larger than the component due to spontaneous-spontaneous beat noise. The point at which the components are roughly equal can be found by equating equations (2) and (3), which leads to $i_{dc} \approx Be$, which implies from equation (1) that Nsp(G−1)≈1, or G≈1.5. In fact, since there is always some additional dark or leakage current which also contributes to the shot noise, the spontaneous-spontaneous beat noise does not generally contribute until the amplifier gain is of order 3–7. Since the spontaneous-spontaneous is quadratic in photocurrent, it quickly dominates the shot noise density beyond the photocurrent at which both components have equal magnitude.

What is claimed is:

1. A system for measuring the frequency response of a wide-bandwidth electrooptic device, comprising:
   generating means for generating an optical signal having a wide-bandwidth spectrum due to spontaneous-spontaneous electrical beat noise emission;
   optical coupling means coupled to said generating means for delivering said optical signal to an input of said electrooptic device;
   said device being responsive to said optical signal for detecting said optical signal and generating a photocurrent derived from said optical signal; and
   measurement means coupled to an output of said electrooptic device for receiving said photocurrent and measuring a power spectrum representative of said photocurrent;
   whereby any frequency roll-off in said measured power spectrum represents the frequency response of said electrooptic device.

2. The system for measuring frequency response as recited in claim 1 wherein said means for generating an optical signal includes:
   a semiconductor optical amplifier appropriately biased during operation to ensure that the photon density within an optical cavity of said amplifier is low compared with the saturation photon density.

3. The system for measuring frequency response as recited in claim 1 wherein said means for generating an optical signal comprises:
   a plurality of semiconductor optical amplifiers cascaded together wherein an output optical signal from one amplifier serves as an input optical signal to a next amplifier in said cascaded sequence, and wherein the last amplifier in said cascaded sequence is coupled to said optical coupling means; and
   each of said optical amplifiers being appropriately biased so that the photon density within said amplifier is low compared with the saturation photon density of said amplifier.

4. The system for measuring frequency response as recited in claim 1 wherein said means for generating an optical signal includes:
   a luminescent optical fiber amplifier; and
   a light source for pumping said luminescent fiber amplifier.

5. The system for measuring frequency response as recited in claim 1 further including:
   an electrical amplifier coupled between said electrooptic device and said measurement means;
   a first 50 ohm impedance matching transmission line connecting said electrooptic device to said electrical amplifier; and
   a second 50 ohm impedance matching transmission line connecting said electrical amplifier to said measurement means.

6. The system for measuring frequency response as recited in claim 1 wherein:
   said electrooptic device is a photodetector.

7. The system for measuring frequency response as recited in claim 5 wherein:
   said measurement means is a spectrum analyzer.

8. The system for measuring frequency response as recited in claim 1 wherein said optical coupling means includes:
   an optical fiber.

9. A system for measuring the frequency response of a wide-bandwidth electrooptic device, comprising:
   generating means for generating an optical signal having a wide-bandwidth spectrum due to both spontaneous-spontaneous and signal-spontaneous electrical beat noise emissions;
   optical coupling means coupled to said generating means for delivering said optical signal to an input of said electrooptic device;
   said device being responsive to said optical signal for detecting said optical signal and generating a photocurrent derived from said optical signal; and
   measurement means coupled to an output of said electrooptic device for receiving said photocurrent and measuring a power spectrum representative of said photocurrent;
   whereby any frequency roll-off in said measured power spectrum represents the frequency response of said electrooptic device.

10. The system for measuring frequency response as recited in claim 9 wherein said means for generating an optical signal comprises:
    a semiconductor optical amplifier;
    a semiconductor laser providing an optical signal which is introduced into said amplifier whereby the signal-spontaneous component of said optical spectrum is generated by optical interference in said electrooptic device between said laser signal and the spontaneous emission from said amplifier.

11. The system for measuring frequency response as recited in claim 9 wherein said means for generating an optical signal comprises:
    a plurality of semiconductor optical amplifiers;
    means for cascading said amplifiers so that an output optical signal from one amplifier serves as an input optical signal to a next amplifier in said cascaded sequence, wherein the last amplifier in said sequence is coupled to said optical coupling means;
    a plurality of semiconductor lasers each coupled to a corresponding one of said optical amplifiers for providing an optical signal which is introduced into said corresponding amplifier; and
    each of said amplifiers being operative in response to the signal from said corresponding laser to generate said wide-bandwidth spectrum.

12. The system for measuring frequency response as recited in claim 11 further includes:
    a plurality of optical isolators each coupled to an output end of a corresponding one of said amplifiers to prevent back-reflections.

13. The system for measuring frequency response as recited in claim 9 wherein said optical coupling means includes:
    an optical fiber.

14. A method of measuring the frequency response of a wide-bandwidth electrooptic device, comprising the steps of:
    generating an optical signal having a wide-bandwidth spectrum due to spontaneous-spontaneous electrical beat noise emission;
    optically coupling said optical signal to an input of said electrooptic device, said device being responsive to said optical signal for detecting said signal and generating a photocurrent derived from said optical signal; and
    determining a power spectrum representative of said photocurrent;

whereby any frequency roll-off in said power spectrum represents the frequency response of said electrooptic device.

15. The method of measuring frequency response as recited in claim 14 wherein said step of generating an optical signal includes the step of:
   providing a semiconductor optical amplifier appropriately biased during operation to ensure that the photon density within an optical cavity of said amplifier is low compared with the saturation photon density.

16. The method of measuring frequency response as recited in claim 14 wherein said step of generating an optical signal includes the steps of:
   providing a plurality of semiconductor optical amplifiers cascaded together wherein an output optical signal from one amplifier serves as an input optical signal to a next amplifier in said cascaded sequence; and
   each of said optical amplifiers being appropriately biased so that the photon density within said amplifier is low compared with the saturation photon density of said amplifier.

17. The method of measuring frequency response as recited in claim 14 wherein said step of generating an optical signal includes the steps of:
   providing a luminescent optical fiber amplifier; and
   pumping said luminescent fiber amplifier with a light source.

18. The method of measuring frequency response as recited in claim 14 further includes the steps of:
   electrically amplifying said photocurrent.

19. The method of measuring frequency response as recited in claim 14 wherein:
   said electrooptic device is a photodetector.

20. The method of measuring frequency response as recited in claim 18 wherein:
   said step of determining a power spectrum includes a spectrum analyzer.

21. The method of measuring frequency response as recited in claim 14 wherein said step of optically coupling said optical signal to an input of said electrooptic device includes the step of:
   providing an optical fiber.

22. A method of measuring the frequency response of a wide-bandwidth electrooptic device, comprising:
   generating an optical signal having a wide-bandwidth spectrum due to both spontaneous-spontaneous and signal-spontaneous electrical beat noise emissions;
   optically coupling said optical signal to an input of said electrooptic device, said device being responsive to said optical signal for detecting said signal and generating a photocurrent derived from said optical signal; and
   determining a power spectrum representative of said photocurrent;
whereby any frequency roll-off in said power spectrum represents the frequency response of said electrooptic device.

23. The system for measuring frequency response as recited in claim 22 wherein said step of generating an optical signal includes the steps of:
   providing a semiconductor optical amplifier;
   driving said amplifier with a semiconductor laser whereby the signal-spontaneous component of said wide-bandwidth spectrum is generated by optical interference in said electrooptic device between the signal emitted by said laser and the spontaneous emission from said amplifier.

24. The method of measuring frequency response as recited in claim 22 wherein said step of generating an optical signal includes the steps of:
   providing a plurality of semiconductor optical amplifiers;
   cascading said amplifiers so that an output optical signal from one amplifier serves as an input optical signal to a next amplifier in said cascaded sequence; and
   driving each of said amplifiers with a corresponding light source, each of said amplifiers being operative in response to the signal from said corresponding laser to generate said wide-bandwidth spectrum.

25. The method of measuring frequency response as recited in claim 24 wherein said step of generating an optical signal further includes the step of:
   preventing back reflections by coupling an optical isolator to an output end of each amplifier.

* * * * *